(12) United States Patent
Yashima et al.

(10) Patent No.: US 9,171,724 B2
(45) Date of Patent: Oct. 27, 2015

(54) SUBSTRATE PROCESSING APPARATUS AND METHOD FOR MANUFACTURING SEMICONDUCTOR DEVICE

(75) Inventors: Shinji Yashima, Toyama (JP); Atsushi Umekawa, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 13/617,783

(22) Filed: Sep. 14, 2012

(65) Prior Publication Data

US 2013/0072034 A1 Mar. 21, 2013

(30) Foreign Application Priority Data

Sep. 15, 2011 (JP) ................... 2011-202165

(51) Int. Cl.
- *H01L 21/00* (2006.01)
- *H01L 21/263* (2006.01)
- *H05B 6/80* (2006.01)

(52) U.S. Cl.
CPC .............. *H01L 21/263* (2013.01); *H05B 6/806* (2013.01)

(58) Field of Classification Search
None
See application file for complete search history.

(56) References Cited

U.S. PATENT DOCUMENTS

| | | | |
|---|---|---|---|
| 6,478,924 B1* | 11/2002 | Shamouilian et al. | 156/345.48 |
| 2002/0046807 A1* | 4/2002 | Hongo | 156/345.37 |
| 2002/0164864 A1 | 11/2002 | Sotani | |
| 2004/0079288 A1* | 4/2004 | Akiyama | 118/715 |
| 2005/0212626 A1 | 9/2005 | Takamatsu | |
| 2007/0224839 A1* | 9/2007 | Shimizu | 438/795 |
| 2009/0004887 A1* | 1/2009 | Suzuki et al. | 438/792 |
| 2011/0111601 A1 | 5/2011 | Okita et al. | |
| 2011/0240598 A1 | 10/2011 | Okayama et al. | |
| 2012/0071005 A1 | 3/2012 | Shimizu | |

FOREIGN PATENT DOCUMENTS

| | | |
|---|---|---|
| JP | S63-207121 A | 8/1988 |
| JP | A-2002-280380 | 9/2002 |
| JP | 2002/289521 A | 10/2002 |
| JP | A-2004-296820 | 10/2004 |
| JP | A-2006-196336 | 7/2006 |
| JP | A-2007-258286 | 10/2007 |
| JP | 2012069614 A * | 4/2012 |
| TW | 201005825 A1 | 2/2010 |
| TW | 201028052 A1 | 7/2010 |

OTHER PUBLICATIONS

Apr. 21, 2014 Office Action issued in Taiwanese Patent Application No. 101120290 (with English translation).
Oct. 11, 2013 Office Action issued in Korean Patent Application No. 10-2012-0102368 (with translation).
May 30, 2014 Examiner's Detailed Grounds for Rejection issued in Korean Patent Application No. 1020120102368 (with English translation).
Jun. 23, 2015 Office Action issued in Japanese Patent Application No. 2011-202165.

* cited by examiner

*Primary Examiner* — Alexander Ghyka
*Assistant Examiner* — Abdulfattah Mustapha
(74) *Attorney, Agent, or Firm* — Oliff PLC

(57) ABSTRACT

A substrate processing apparatus includes a process chamber which processes a substrate, a conductive substrate support table which is installed within the process chamber, a dielectric plate on which the substrate is mounted, the dielectric plate being placed on the substrate support table, a microwave generator which is installed outside the process chamber, and a microwave supplying unit which supplies a microwave generated by the microwave generator into the process chamber.

6 Claims, 4 Drawing Sheets

SUBSTRATE PROCESSING APPARATUS AND METHOD FOR MANUFACTURING SEMICONDUCTOR DEVICE

CROSS-REFERENCE TO RELATED APPLICATION

This application is based upon and claims the benefit of priority from Japanese Patent Application No. 2011-202165, filed on Sep. 15, 2011, the entire contents of which are incorporated herein by reference.

TECHNICAL FIELD

The present disclosure relates to a substrate processing technique for forming semiconductor devices such as integrated circuits (ICs) on a substrate, and more particularly, to a semiconductor manufacturing apparatus which processes a substrate, such as a semiconductor wafer (hereinafter referred to as a "wafer"), using a microwave and manufactures a semiconductor device, a substrate processing apparatus which processes a substrate, and a method for manufacturing a semiconductor device.

BACKGROUND

A semiconductor manufacturing process may include a wafer level packaging (WLP) technique which processes a wafer into complete semiconductor packages. In this technique, rewiring, resin sealing and bump soldering, which are required for the semiconductor packages, are performed for the wafers in which ICs are fabricated, and the wafer is segmentalized into the semiconductor packages up to the same size as an IC chip.

In typical LSI manufacturing, a pre-process is followed by a post-process including back grinding to polish and thin a wafer, dicing to segmentalize the wafer or cut off the wafer into chips, mounting to mount the chips on a pad, adhesion, molding, finishing, testing, etc. On the other hand, SiP (System in Package) (which is a kind of WLP) manufacturing includes an intermediate process between a pre-process and a post-process. The intermediate process may include a rewiring process to process an upper part of the wirings of a chip between receipt of a wafer processed in the pre-process and back grinding. In addition, an interlayer insulating film is formed using a polyimide or the like, a Cu wiring is formed, and soldering balls are mounted on a leading end of the Cu wiring.

Since wafer polishing and the like are required after the intermediate process, care is required in the thickness, bending, the heating treatment temperature and so on of the wafer.

When the interlayer insulating film is formed using the polyimide, the polyimide is heated and cured. However, in a heating and curing process using a conventional resistive heater, it is not easy to prevent the wafer from being bent since the wafer is hot per se. Accordingly, there is a desire for a technique capable of heating and curing a polyimide while keeping a wafer at a low temperature.

A semiconductor manufacturing process may also include a CVD (Chemical Vapor Deposition) process which subjects a surface of a substrate (a target substrate having a silicon wafer or glass as a base and including fine patterns of electrical circuits formed thereon) to a predetermined film forming process. In this CVD process, the substrate is loaded into an airtight reaction chamber and heated by a heating means disposed in the reaction chamber to cause a chemical reaction while introducing film forming gas onto the substrate, so that a film can be uniformly formed on a fine pattern of electrical circuits formed on the substrate. With such a CVD process, for example, organic chemical material may be used as a film forming raw material to form a high-k (high dielectric) film, which is an insulating film having a relatively large dielectric constant such as a ZrO (zirconia) film or the like.

However, since a ZrO film contains a large quantity (several percentages (%)) of impurities such as CH, OH and the like, which are produced due to the organic material, its electrical insulation is insufficient. For the purpose of securing electrical insulation and stabilization of this thin film, an attempt has been made to subject a ZrO film to a fast annealing process in a temperature range of 650 degrees C. to 800 degrees C. under an oxygen ($O_2$) or nitrogen ($N_2$) atmosphere to remove impurities such as carbon (C), hydrogen (H) and the like from the film to densify the film, thereby modifying the film into a stable insulating film. This densification is performed to shorten an average interatomic distance in an amorphous state without leading to crystallization. In such a fast annealing process, the entire substrate is heated to a predetermined temperature to modify the ZrO film.

Meanwhile, in recent semiconductor devices, shallow junctions are widely used for device miniaturization and there is a need for a small thermal budget (heat history). Accordingly, even in the annealing process used in the above-described high-film forming process, there is a need to densify a high-k film by heating the high-k film while keeping a substrate at a low temperature, and removing impurities from the high-k film, thereby achieving a small thermal budget. The reason for keeping the substrate at a low temperature is as follows: in some device manufacturing processes, if the substrate is processed in a post-process at a temperature higher than that in a pre-process, a device already established in the pre-process may be collapsed or a characteristic of a film may be varied. Therefore, the process temperature in the post-process cannot exceed that in the pre-process. Accordingly, there is a desire for a technique capable of performing a film reforming process at a low temperature for the enhancement of device performance In the related art, there is known a technique for forming a high dielectric film, which contains hafnium, on a substrate in a film forming process, and then supplying argon radicals onto the substrate and removing impurity elements from the high dielectric film in a modifying process.

SUMMARY

The present disclosure provides some embodiments of a substrate processing technique capable of preventing a temperature of a substrate from being excessively increased, and heating the substrate including a polyimide film or a high-k film while suppressing a thermal budget from being increased.

The present disclosure involves heating a heating target such as a polyimide film or a high-k film while suppressing a substrate from being excessively heated by using a microwave with a dielectric interposed between a conductive substrate support table and the substrate.

According to one embodiment of the present disclosure, there is provided a substrate processing apparatus including: a process chamber configured to process a substrate; a conductive substrate support table installed within the process chamber; a dielectric plate on which the substrate is mounted, the dielectric plate being placed on the substrate support table; a microwave generator installed outside the process chamber; and a microwave supplying unit configured to supply a microwave generated by the microwave generator into the process chamber.

According to another embodiment of the present disclosure, there is provided a method for manufacturing a semiconductor device by using a substrate processing apparatus including a process chamber configured to process a substrate, a conductive substrate support table installed within the process chamber, a dielectric plate on which the substrate is mounted, the dielectric plate being placed on the substrate support table, a microwave generator installed outside the process chamber, and a microwave supplying unit configured to supply a microwave generated by the microwave generator into the process chamber, including the steps of: carrying the substrate into the process chamber and mounting the substrate on the dielectric plate placed on the substrate support table; supplying the microwave from the microwave supplying unit into the process chamber and processing the substrate mounted on the dielectric plate; and carrying the substrate out of the process chamber after processing the substrate.

DETAILED DESCRIPTION

Figure 1:
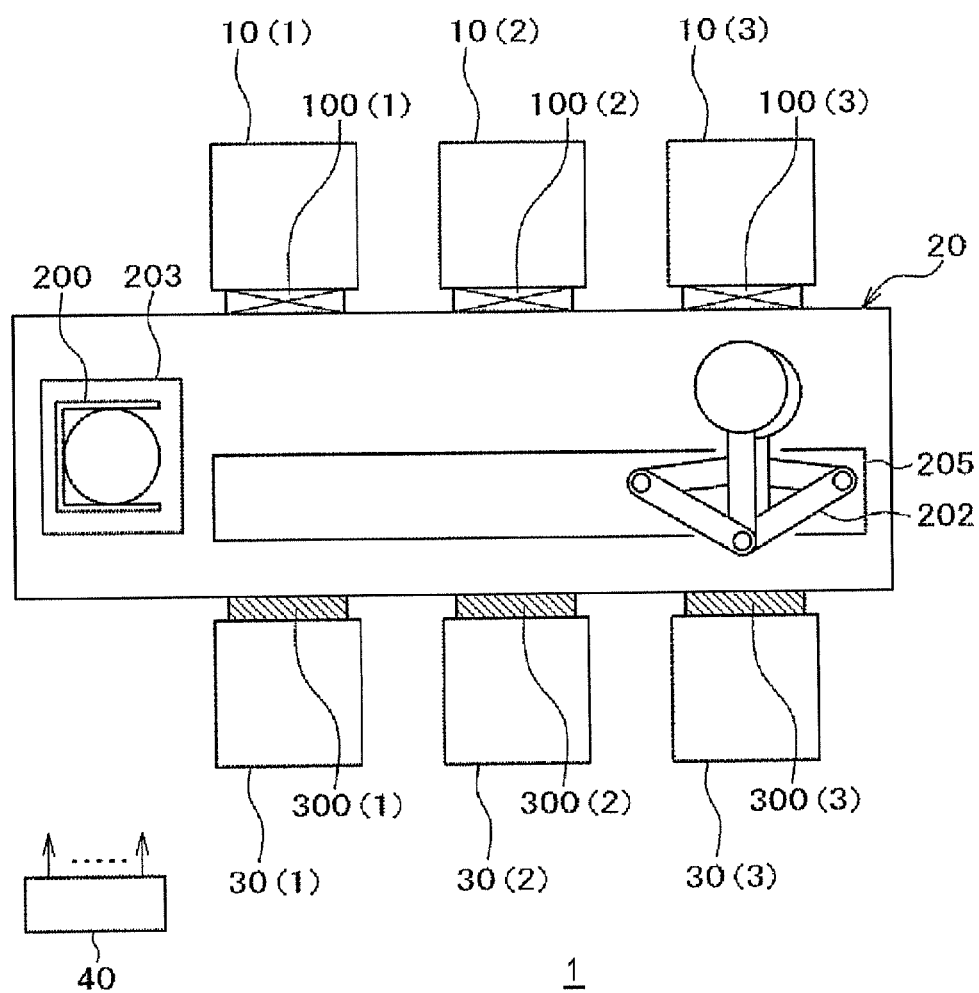
FIG. 1 is a schematic plan view showing a configuration of a substrate processing apparatus in accordance with an embodiment of the present disclosure.
Figure 2:
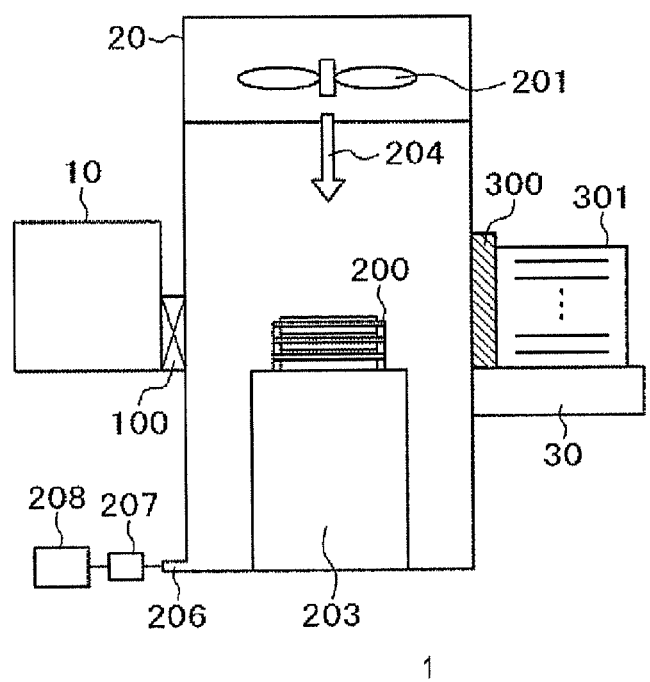
FIG. 2 is a schematic side view showing a configuration of the substrate processing apparatus in accordance with an embodiment of the present disclosure.

A substrate processing apparatus 1 in accordance with an embodiment of the present disclosure will now be described with reference to FIGS. 1 and 2. FIG. 1 is a schematic plan view showing a configuration of the substrate processing apparatus 1 when viewed from top. FIG. 2 is a schematic side view showing a configuration of the substrate processing apparatus 1 when viewed from side.

The substrate processing apparatus 1 in accordance with an embodiment of the present disclosure is implemented with a semiconductor manufacturing apparatus which performs predetermined processes used to manufacture a semiconductor device. In the following description, the substrate processing apparatus 1 in accordance with the embodiment of the present disclosure will be illustrated as an apparatus for heating a wafer using a microwave.

The substrate processing apparatus 1 in accordance with the embodiment of the present disclosure includes, at least, one or more process modules (PMs) 10, each including a process chamber for performing a predetermined process for a wafer, an equipment front end module (EFEM) 20 including a transfer chamber in which the wafer is transferred, and one or more load ports (LPs) 30 serving as a receiver mounting table which exchanges a substrate receiver (for example, a front-opening unified pod (FOUP), hereinafter referred to as a "pod") for receiving and transporting the wafer with an external transfer device of the substrate processing apparatus 1.

Although three process modules 10 and three load ports 30 are shown in this example, the present disclosure is not limited thereto.

The substrate processing apparatus 1 may further includes a controller 40 serving as a control part for executing a program file to control a transfer robot 202 (which will be described later) serving as a substrate transferring part and to transfer the wafer between the process modules 10, the front end module 20 and the load ports 30. In addition, the controller 40 executes the program file to control various components constituting each of the process modules 10 and to process the wafer within the process modules 10.

<Process Module 10>

Each process module 10 subjects the wafer to such treatments as a heating treatment (annealing), a film modifying treatment and the like. Details of the process module 10 will be described later.

Each process module 10 can communicate with the front end module 20 via a gate valve (GV) 100.

<Front End Module 20>

The front end module 20 includes a substrate mounting table 200 on which the wafer processed by the process modules 10 is mounted, the transfer robot 202, a fan 201, etc.

The substrate mounting table 200 is placed on a table 203 in an inner space of the front end module 20. The table 203 is located such that it does not overlap with a robot support 205 for supporting the transfer robot 202 and does not block the gate valves 100 and shutters 300.

The fan 201 is attached to the ceiling of the front end module 20. The fan 201 is used to supply dust-free air from the ceiling toward the substrate mounting table 200, the transfer robot 202 and the bottom of the front end module 20, thereby producing an air flow 204.

An exhaust pipe 206 for exhausting the air supplied by the fan 201 is placed in a lower portion of the front end module 20. The exhaust pipe 206 is connected to a gas discharging valve 207 and a pump 208, which together are used to control exhaustion of an internal atmosphere of the front end module 20.

The produced air flow 204 allows the interior of the front end module 20 to be in a clean air condition at all times, and the exhaustion by the exhaust pipe 206 prevents dusts and the like from staying in the front end module 20.

As an alternative to such an exhaust unit of the front end module 20, including the exhaust pipe 206, the gas discharging valve 207 and the pump 208 for actively exhausting the internal atmosphere, the exhaust unit of the front end module 20 may be constructed as follows.

Slits, each having an adjustable opening area, may be formed in the lower portion of the front end module 20. In this case, the interior of the front end module 20 is adjusted to have a pressure which is slightly higher than that of the exterior thereof in order to prevent particles from being introduced from the exterior into the interior. The air flow 204 produced by the fan 201 exhausts the internal atmosphere to the exterior of the front end module 20 through the slits formed in the lower portion of the front end module 20. This configuration can provide a cheaper apparatus.

The transfer robot 202 is supported by the robot support 205, as described above. In addition, the transfer robot 202 includes arms and their support shaft which are configured to be horizontally rotated to transfer the wafer between one of the process modules 10, a pod 301 mounted on each load port 30, and the substrate mounting table 200.

In addition, the transfer robot 202 is configured to be horizontally slid on the robot support 205 in parallel to the arrangement direction of the process modules 10 in order to move to the neighborhoods of each gate valve 100(1) to 100(3), each shutter 300(1) to 300(3) and the substrate mounting table 200.

This configuration allows the transfer robot 202 to transfer the wafer between the process modules 10, the pods 301 mounted on the load ports 30, and the substrate mounting table 200.

The transfer robot 202 includes an upper arm and a lower arm, each of which serves as a substrate holder for holding the wafer. For example, the transfer robot 202 is configured to carry a raw wafer placed on an end portion of the upper arm into each process module 10 and carry a processed wafer within each process module 10, which is placed on an end portion of the lower arm, out of each process module 10 (that is, perform a wafer replacing and transferring operation).

The substrate mounting table 200 serves to mount and support the processed wafer which has been heated by the process modules 10. The air flow 204 is supplied for the mounted wafer in order to cool the heated wafer.

Although it is shown in FIGS. 1 and 2 that the number of process modules 10 and the number of wafers received in the substrate mounting table 200 are equal to each other (3), the present disclosure is not limited thereto, and the number of process modules 10 may be appropriately varied depending on wafer transfer time. In addition, the front end module 20 may communicate with the load ports 30 via the shutters 300.

<Load Port 30>

The load port 30 is a mounting table on which the pod 301 serving as a substrate receiver is mounted, and is provided in plural. Although it is shown in FIG. 1 that the number of load ports 30 is equal to the number of process modules 10, the number of load ports 30 may be varied depending on a wafer transfer method which will be described later. Specifically, if wafers are transferred according to a distribution scheme of transferring wafers from one pod 301 to a plurality of process modules 10, at least one load port 30 may be provided. If wafers are transferred according to a parallel scheme of transferring wafers from a plurality of pods 301 to a plurality of process modules 10, a predetermined number of load ports 30 may be provided depending on the transfer recipe describing a transfer destination.

<Wafer Transfer Method>

Figure 3:
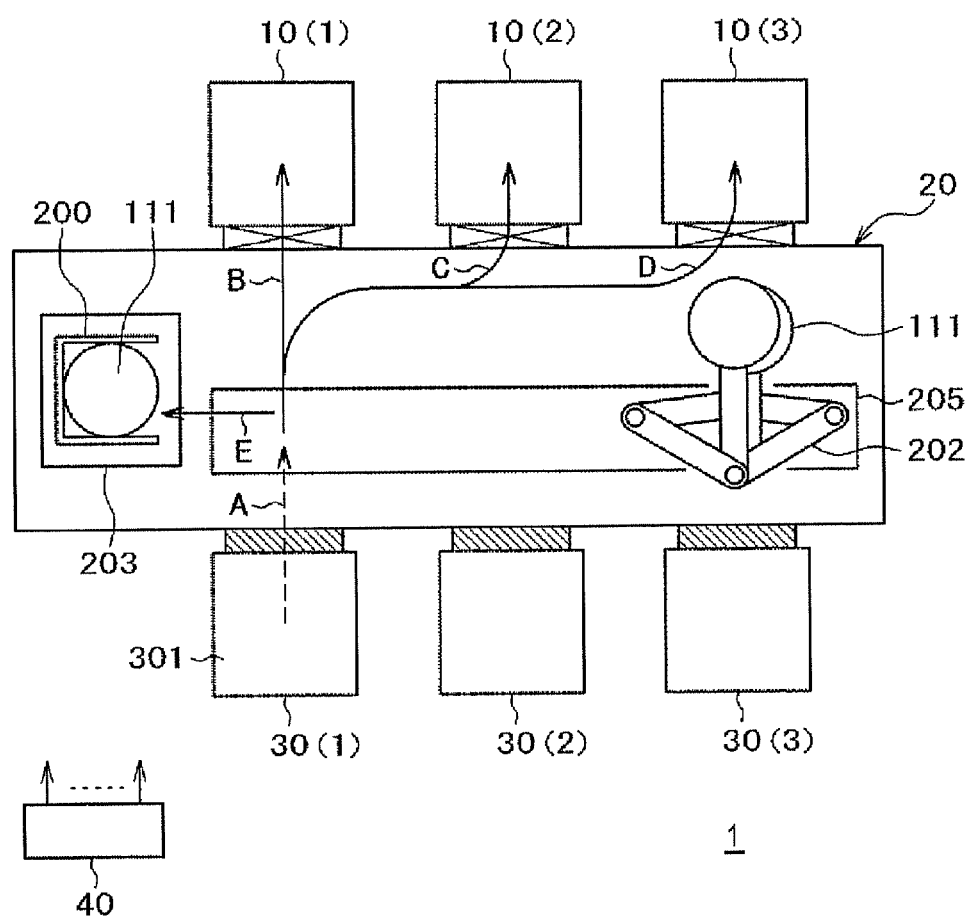
FIG. 3 is an explanatory view of a flow of substrate transfer in the substrate processing apparatus in accordance with an embodiment of the present disclosure.

A wafer transferring method of the substrate processing apparatus 1 in accordance with an embodiment of the present disclosure will be described below with reference to FIG. 3. FIG. 3 is a view used to explain a distribution scheme of transferring wafers 111 received in one pod 301, one by one, to each process module 10. In this example, it is assumed that wafers are transferred between a load port 30(1) and process modules 10(1) to 10(3).

First, a (first) wafer 111 is taken out of the pod 301 mounted on the load port 30(1), as indicated by an arrow A, and is carried into the process module 10(1), as indicated by an arrow B.

Second, a (second) wafer 111 is taken out of the pod 301 mounted on the load port 30(1), as indicated by the arrow A, and is carried into the process module 10(2), as indicated by an arrow C.

Third, a (third) wafer 111 is taken out of the pod 301 mounted on the load port 30(1), as indicated by the arrow A, and is carried into the process module 10(3), as indicated by an arrow D.

The wafers 111 processed in the process modules 10(1) to 10(3) are mounted on the substrate mounting table 200, as indicated by an arrow E, and are cooled by the air flow 204. The cooled wafers 111 are sequentially taken out and transferred to the pod 301 of the load port 30(1).

<Details of Process Module 10>

Subsequently, the process module 10 shown in FIG. 1 will be described in detail with reference to FIG. 4.

Figure 4:
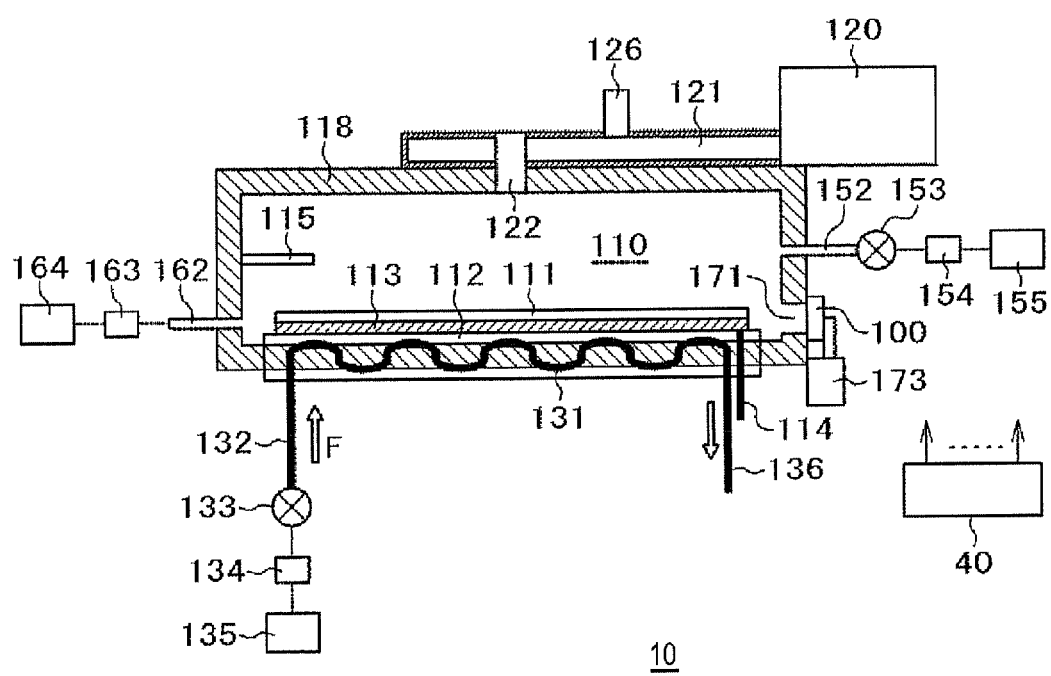
FIG. 4 is a vertical sectional view of a process module of the substrate processing apparatus in accordance with an embodiment of the present disclosure.

FIG. 4 is a vertical sectional view of the process module 10 in accordance with an embodiment of the present disclosure. The process module 10 includes a process chamber 110, a microwave generator 120, a gas supplying unit including a gas supplying pipe 152 and so on, a gas discharging unit including a gas discharging pipe 162 and so on, a cooling unit including a refrigerant supplying pipe 132 and so on, etc.

The process chamber 110 processes a wafer 111, for example, a silicon wafer, serving as a dielectric semiconductor substrate. The process chamber 110 includes a conductive substrate support table 112 on which a dielectric plate 113 is placed. On the dielectric plate 113, the wafer 111 is mounted.

<Microwave Generator and Microwave Supplying Unit>

The microwave generator 120 generates, for example, a frequency-fixed microwave. Examples of the microwave generator 120 may include a magnetron, a klytron, a gyrotron and the like. The microwave generated in the microwave generator 120 is introduced from a wave guide port 122 into the process chamber 110 through a wave guide path 121. A matching mechanism 126 to lessen the internal reflected power of the wave guide path 121 is disposed on the wave guide path 121.

A surface of the wafer 111 is irradiated with the microwave introduced into the process chamber 110. The microwave with which the wafer 111 within the process chamber 110 is irradiated is absorbed by the wafer 111 which is then dielectrically heated by the microwave.

A microwave supplying unit includes the wave guide path 121, the wave guide port 122 and the matching mechanism 126.

Microwave heating is dielectric heating and its heating value depends on the product of a dielectric constant $\in$ and tan δ (dielectric tangent) of a target to be heated. Based on this nature, it is apparent that, if materials having different properties are simultaneously irradiated with a single microwave, only a material which is more likely to be heated, that is, a material having a larger product of a dielectric constant $\in$ and tan δ, can be selectively heated. As a result, when an appropriate microwave frequency is chosen, a polyimide film or a high-k film on a surface of a wafer can be selectively heated.

In this example, the product of a dielectric constant and a dielectric tangent (tan δ) of the dielectric plate 113 is set to be smaller than the product of a dielectric constant and a dielectric tangent of a polyimide film or a high-k film. Accordingly, the dielectric plate 113 is less likely to be heated than the polyimide film or the high-k film and thus is almost barely heated.

<Process Chamber>

The process chamber 110 is formed by a process container 118 made of, for example, a metal material such as aluminum (Al), stainless steel (SUS) or the like. The process container 118 has a structure capable of shielding a microwave between the exterior and the interior of the process chamber 110.

The process chamber 110 includes the substrate support table 112 which mounts and supports the wafer 111. The dielectric plate 113 is mounted on the substrate support table 112. In this embodiment, the dielectric plate 113 has the same shape as the substrate and is equal to or slightly larger than the substrate when viewed from top. If the wafer 111 is circular, the dielectric plate is circular as well. Thus, the dielectric plate 113 is arranged in a space between the substrate support table 112 and the wafer 111.

The substrate support table 112 is formed of a conductor made of a metal such as aluminum (Al) or the like. The substrate support table 112 has a disc shape or a cylindrical shape having an outer diameter larger than that of the wafer 111 when viewed from top.

Since the substrate support table 112 has conductivity, a potential of a microwave in the substrate support table 112 becomes zero. Accordingly, if the wafer 111 is directly placed on the substrate support table 112, an electric field intensity of the microwave in the wafer 111 becomes weak. Thus, in this embodiment, the dielectric plate 113 is used to locate the wafer 111 at a position which is separated by an odd-number times of a ¼ wavelength (λ/4) of the microwave from a front surface of the substrate support table 112. That is, the wafer 111 is located at a position where the microwave has a peak potential (a position where a waveform of the microwave has a maximum amplitude).

As used herein, "front surface of the substrate support table 112" refers to a surface facing a rear surface of the wafer 111. Since an electric field is strong at a position which is separated by an odd-number times of λ/4 from the front surface of the substrate support table 112, the wafer 111 can be efficiently heated with the microwave.

In addition, it is preferable to set the microwave potential to have a peak at a vertical position of a target to be heated, such as a polyimide film, a high-k film or the like. For example, if the target to be heated, such as a polyimide film, a high-k film or the like, is formed on a front surface of the wafer 111, the front surface of the wafer 111 is set to be located at a position where the microwave potential has a peak.

Accordingly, the thickness of the dielectric plate 113 is determined as follows. Assuming that a wavelength of the microwave in the dielectric plate 113 is $\lambda_d$, it is preferable that the thickness of the dielectric plate 113 is set to be equal to an odd-number times of $\lambda_d/4$. It is known that a wavelength of a microwave in a dielectric is proportional to the reciprocal of the square root of a dielectric constant of the dielectric.

Accordingly, assuming that a dielectric constant of the dielectric plate 113 is $\in$ and a wavelength of the microwave in a vacuum (a free space wavelength) is λ, since $\lambda_d=\lambda/(\sqrt{\in})$, the thickness of the dielectric plate 113 is equal to an odd-number times of $(\lambda/4)/(\sqrt{\in})$, that is, an odd-number times of $(\lambda/4)\times(\in)^{-1/2}$.

In this embodiment, for example, a microwave fixed at 2.45 GHz as a representative frequency is used and the height from the substrate support table 112 to the wafer 111 is set to be equal to a ¼ wavelength. Since the wavelength λ of the microwave in a vacuum is 122 mm, λ/4 is 30.5 mm. In this embodiment, the dielectric plate 113 is made of quartz. As will be described later, since a dielectric constant of quartz is about 3.81, the thickness of the dielectric plate 113, that is, the height from the substrate support table 112 to the wafer 111, is set to be equal to $\lambda_d/4$, i.e., $(30.5\text{ mm})\times(3.81)^{-1/2}=30$ mm.

In addition, since the substrate support table 112 has conductivity, the microwave is reflected at a front surface of the substrate support table 112 without consuming microwave energy. Since the wafer 111 is located at a position ($\lambda_d/4$) where the potential of the reflected microwave has a peak, the wafer 111 can also be efficiently heated by the microwave reflected from the substrate support table 112.

In addition, if the thickness of the dielectric plate 113 is close to an odd-number times of the ¼ wavelength of the microwave, since the wafer 111 is located near a position where the microwave potential has a peak, even when the thickness is different by a certain degree, for example, a ⅙ wavelength or a ⅛ wavelength, from an odd-number times of the ¼ wavelength, the above-mentioned effects can still be achieved to some extent. In addition, in consideration of a cooling effect of the wafer 111, which will be described later, the thickness of the dielectric plate 113 is preferable to be equal to the ¼ wavelength of the microwave or a wavelength close to the ¼ wavelength, for example, within a ⅛ wavelength range (⅛ to ⅜ wavelength) or a 1/16 wavelength range (3/16 to 5/16 wavelength) centered on the ¼ wavelength.

The dielectric plate 113 is made of a material having high thermal conductivity to facilitate transfer of heat of the wafer 111 to the substrate support table 112. The material is less heated by the microwave, that is, the material has a small product of tan δ (dielectric tangent) and a dielectric constant. In this example, at a minimum, the material has a product of tan δ and a dielectric constant that is smaller than that of the dielectric material of a target to be heated.

Examples of the material of the dielectric plate 113 may include quartz, alumina, Teflon® and the like. The product of tan δ and a dielectric constant of a polyimide film or a high-k film such as a ZrO film is larger than the product of tan δ and a dielectric constant of silicon, which is the material of the wafer 111, and quartz, which is the material of the dielectric plate 113. In addition, the product of tan δ and a dielectric constant of quartz is smaller than that of silicon. Accordingly, when the polyimide film or the ZrO film is heated by the microwave, the wafer 111 can be suppressed from being heated, while the quartz dielectric plate 113 can be further suppressed from being heated than the wafer 111, i.e., can be almost barely heated.

In addition, since a dielectric constant of quartz is about 3.81, a wavelength of the microwave in quartz is $(3.81)^{-1/2}$ time as large as, i.e., about half (0.512 time) of, that in a vacuum. In other words, a distance between the wafer 111 and the substrate support table 112 may be set to be about half of that in the case where the dielectric plate 113 is not used, thereby decreasing the thickness of the dielectric plate 113.

In addition, the thermal conductivity of quartz is 1.38 (W/m·K), which is larger than that $(25.83\times10^{-3}$ (W/m·K)) of nitrogen and that (0.1513(W/m·K)) of helium. Accordingly, in comparison to filling the space between the wafer 111 and the substrate support table 112 with nitrogen or helium, filling the space with quartz provides an increased cooling effect, which is 1070 times as high as that by nitrogen and 117 times as high as that by helium in combination with the above-mentioned wavelength shortening effect.

In this manner, the dielectric plate 113 shows an excellent cooling effect irrespective of whether or not the thickness of the dielectric plate 113 is equal to the ¼ wavelength of the microwave.

With the above-described configuration, the wafer 111 can be located at a peak position (position of the maximum amplitude of a waveform) of the microwave, which results in high heating efficiency of the wafer 111. Such high heating efficiency may lead to overheating of the wafer 111 in conjunction with heat transferred from the polyimide film or the high-k film, and therefore, an increase in a thermal budget has to be considered.

However, by placing the substrate support table 112 made of a metal having high thermal conductivity at a position facing the rear surface of the wafer 111 and placing the dielectric plate 113 having high thermal conductivity on the substrate support table 112, it is possible to take away heat from the entire rear surface of the wafer 111. As a result, the wafer 111 can be uniformly cooled to prevent the wafer 111 from being overheated.

<Cooling Unit>

A refrigerant passage 131 through which a refrigerant used to cool the wafer 111 is flowed is formed within the substrate support table 112. Although, in this embodiment, water is used for the refrigerant, the refrigerant may be one of any other refrigerants, such as a cooling chiller and the like. The refrigerant passage 131 is connected to the refrigerant supplying pipe 132 for supplying the refrigerant into the refrigerant passage 131 and a refrigerant discharging pipe 136 for discharging the refrigerant out of the refrigerant passage 131, and is configured such that the refrigerant is flowed in a direction indicated by an arrow F in the figure. The refrigerant supplying pipe 132 is connected to an opening/closing valve 133 for opening/closing the refrigerant supplying pipe 132, a flow rate control device 134 for controlling a flow rate of the refrigerant and a refrigerant source 135 in order from the downstream. The opening/closing valve 133 and the flow rate control device 134 are electrically connected to and controlled by the controller 40.

The cooling unit is mainly constituted by the refrigerant passage 131, the refrigerant supplying pipe 132, the opening/closing valve 133, the flow rate control device 134, the refrigerant source 135 and the refrigerant discharging pipe 136. The cooling unit may be implemented by a Peltier device and so on. The use of the cooling unit allows the wafer 111 and the dielectric plate 113 to be further cooled.

<Temperature Detector>

A temperature detector 114 for detecting a temperature of the dielectric plate 113 is provided within the dielectric plate 113 (preferably near the wafer 111) or at the rear surface (a surface contacting the substrate support table 112) of the dielectric plate 113. An example of the temperature detector 114 may include a thermocouple.

In addition, a temperature detector 115 for detecting a temperature of the wafer 111 is provided above the wafer 111 within the process chamber 110. An example of the temperature detector 115 may include an infrared sensor.

The temperature detectors 114 and 115 are electrically connected to the controller 40. If the temperature of the dielectric plate 113 detected by the temperature detector 114 is higher than a predetermined temperature, or the temperature of the wafer 111 detected by the temperature detector 115 is higher than a predetermined temperature, the controller 40 controls the opening/closing valve 133 and the flow rate control device 134 to regulate a flow rate of the coolant flowing into the refrigerant passage 131 such that the temperature of the dielectric plate 113 decreases to the predetermined temperature or the temperature of the wafer 111 decreases to the predetermined temperature.

<Gas Supplying Unit>

The gas supplying pipe 152 for supplying a gas such as, for example, nitrogen ($N_2$) or the like is installed at a side wall of the process chamber 110. The gas supplying pipe 152 is connected to a gas supplying source 155, a flow rate control device 154 for controlling a flow rate of gas, and a valve 153 for opening/closing a gas passage in order from the upstream. When the valve 153 is opened/closed, the gas is supplied or shut off from the gas supplying pipe 152 into the process chamber 110. The flow rate of gas is regulated by the flow rate control device 154. The gas supplied from the gas supplying pipe 152 is used to cool the wafer 111 or used as purge gas to extrude the internal gas of the process chamber 110.

The gas supplying unit is constituted by the gas supplying source 155, the flow rate control device 154, the valve 153 and the gas supplying pipe 152. The flow rate control device 154 and the valve 153 are electrically connected to and controlled by the controller 40.

<Gas Discharging Unit>

The gas discharging pipe 162 for discharging the internal gas out of the process chamber 110 is installed at a side wall of the process chamber 110, for example, in a lower portion of the rectangular parallelepiped process container 118. The gas discharging pipe 162 is located to be lower than the front surface of the wafer 111 mounted on the substrate mounting table 112. The gas discharging pipe 162 is connected to a pressure control valve 163 and a vacuum pump 164 as an exhauster in order from the upstream. The internal pressure of the process chamber 110 is adjusted to a desired value by controlling an opening of the pressure control valve 163.

The gas discharging unit is constituted by the gas discharging pipe 162, the pressure control valve 163 and the vacuum pump 164. The pressure control valve 163 and the vacuum pump 164 are electrically connected to and controlled by the controller 40.

<Wafer Transfer Port>

A wafer transfer port 171 for transferring the wafer 111 into/out of the process chamber 110 is provided at one side wall of the process container 118. The gate valve 100 is disposed at the wafer transfer port 171. When the gate valve 100 is opened by a gate valve driver 173, the interior of the process chamber 110 communicates with the interior of the front end module 20. When the gate valve 100 is opened, the transfer robot 202 in the front end module 20 carries the wafer 111 out of the process chamber 110.

<Example of Heating Treatment in Process Module>

A substrate processing operation of the substrate processing apparatus 1 in accordance with an embodiment will be now described. Substrate processing in this embodiment may be one of a plurality of steps used to manufacture a semiconductor device. The substrate processing operation is controlled by the controller 40. Here, a heating treatment in the process module 10 is described in detail. The heating treatment is performed in the order of a substrate carrying-in step, a nitrogen gas replacing step, a heat treating step and a substrate carrying-out step.

<Substrate Carrying-In Step>

In the substrate carrying-in step of carrying the wafer 111 into the process chamber 110, the gate valve 100 is first opened to communicating the process chamber 110 with the front end module 20. Next, the wafer 111 to be processed is carried from the front end module 20 into the process chamber 110 by the transfer robot 202. The wafer 111 carried into the process chamber 110 is mounted on the dielectric plate 113 placed on the substrate support table 112 by the transfer robot 202. When the transfer robot 202 returns from the interior of the process chamber 110 to the interior of the front end module 20, the gate valve 100 is closed.

<Nitrogen Gas Replacing Step>

After the wafer 111 is carried into the process chamber 110, the internal atmosphere of the process chamber 110 is replaced with a nitrogen ($N_2$) atmosphere. Since an external air atmosphere is drawn into the process chamber 110 when the wafer 111 is carried into the process chamber 110, the internal atmosphere of the process chamber 110 is replaced with $N_2$ in order to prevent water and oxygen in the air atmosphere from having an effect on the process. The $N_2$ gas is introduced from the gas supplying pipe 152 into the process chamber 110 while the gas (atmosphere) in the process chamber 110 is being discharged from the gas discharging pipe 162 by the vacuum pump 164. At this time, the internal pressure of the process chamber 110 is adjusted to a predetermined value (e.g., the atmospheric pressure) by controlling the opening of the pressure control valve 163.

The gas replacing step may be performed as a part of a preparatory step before the wafer processing begins. In addition, the internal atmospheres of the plurality of process chambers 110 may be replaced with a nitrogen atmosphere at one time.

<Heat Treating Step>

Next, a microwave generated in the microwave generator 120 is introduced from the wave guide port 122 into the process chamber 110 and the front surface of the wafer 111 is irradiated with the generated microwave. For example, the microwave irradiation heats a high-k film formed on the front surface of the wafer 111 to 100 to 600 degrees C. to modify the high-k film. Specifically, impurities such as C, H and so on can be removed from the high-k film to modify the high-k film as a densified stable insulating film (film quality enhancement). A dielectric such as the high-k film or the like has different microwave absorption rates depending on the product of tan δ and a dielectric constant. A larger product of tan δ and a dielectric constant can provide a higher microwave absorption rate. When the wafer 111 is irradiated with a high power microwave, the dielectric film on the wafer 111 is more readily heated and modified.

Regarding annealing of the high-k film, the high-k film has a larger product of tan δ and a dielectric constant than that of silicon, which is the substrate material of the wafer 111, and that of quartz, which is the material of the dielectric plate 113. Accordingly, when the wafer on which the high-k film is formed is irradiated with the microwave, only the high-k film is selectively heated. In addition, high power microwave irradiation provides a higher film modification effect. Accordingly, when the wafer is irradiated with the high power microwave, a temperature of the high-k film can be rapidly increased.

If the high-k film continues to be heated by continuously supplying the microwave, a film other than the high-k film may be heated by heat conduction from the high-k film to the silicon substrate.

In this case, if a process temperature in this step becomes higher than that in the previous step, an established device may be collapsed or a characteristic of a film may be varied. Therefore, it is preferable that the process temperature in this step not exceed that in the previous step.

Accordingly, in this embodiment of the present disclosure, the temperature of the wafer 111 is suppressed from being increased by supplying the coolant into the refrigerant passage 131 during the microwave irradiation. Preferably, a flow rate of the coolant flowing into the refrigerant passage 131 is regulated by controlling the flow rate control device 134 such that the temperature of the wafer 111 is lower than an upper limit temperature. At this time, a cooling effect can be improved by the dielectric plate 113. In this manner, by making the process temperature of the wafer 111 constant, even when a plurality of wafers is processed, the processed wafers can be maintained in a uniform state.

In addition, in the heat treating step, while opening the gas supplying valve 153 to introduce the $N_2$ gas from the gas supplying pipe 152 into the process chamber 110 and adjusting the internal pressure of the process chamber 110 to a predetermined valve (e.g., the atmospheric pressure) by means of the pressure control valve 163, the $N_2$ gas in the process chamber 110 is discharged from the gas discharging pipe 162. Thus, in the heat treating step, the wafer 111 can be cooled by running the $N_2$ gas while keeping the internal pressure of the process chamber 110 at the predetermined value. In this embodiment, the heat treating step is performed for 5 minutes under the conditions where the power of the microwave having a frequency of 2.45 GHz is 1600 W and the internal pressure of the process chamber 110 is the atmospheric pressure. After performing the heat treating step for a predetermined period of time using the introduced microwave, the introduction of the microwave is stopped. Although it is here shown that the heat treating step is performed without rotating the wafer 111 in a horizontal direction, the heat treating step may be performed while rotating the wafer 111.

In addition, although the high-k film is heated in the above-described heat treating step, it is to be understood that portions of the substrate other the high-k film may be heated by setting an appropriate wavelength of the microwave.

<Substrate Carrying-Out Step>

After the heat treating step is completed, the heat treated wafer 111 is carried out of the process chamber 110 and is transferred into the front end module 20 according to a procedure reverse to that in the substrate carrying-in step.

The present embodiments as described above may have at least the following effects (1) to (5):

(1) A cooling effect of the substrate can be improved by inserting the dielectric plate between the substrate support table and the substrate since a distance between the substrate support table and the substrate with the dielectric plate therebetween can be smaller than that in the case where a gas is inserted between the substrate support table and the substrate. In addition, since the thermal conductivity of the dielectric plate is higher than that of a gas, the cooling effect of the substrate can be further improved.

(2) Since a microwave at a vertical position of the substrate can have a high electric field intensity, the substrate can be efficiently heated.

(3) Since a material having a large product of a dielectric constant and tan δ, such as the polyimide film or the high-k film, can be selectively heated and the dielectric plate having a smaller product of a dielectric constant and tan δ than that of the polyimide film or that of the high-k film can be suppressed from being heated, it is possible to heat the substrate including the polyimide film or the high-k film at a lower temperature than the related art while preventing the temperature of the substrate from being excessively increased.

(4) It is possible to control a degree of cooling of the substrate depending on the process by using the temperature detector provided within the process chamber.

(5) It is possible to control a degree of cooling of the dielectric plate depending on the process by using the temperature detector contacting the dielectric plate.

The present disclosure is not limited to the above-described embodiments but it is to be understood that the present disclosure may be modified in different ways without departing from the spirit and scope of the disclosure.

The embodiments of the present disclosure may be configured to have at least one of the above-described effects (1) to (5).

In addition, although $N_2$ gas is used in the above embodiments, other gases having high thermal conductivity (e.g., diluted He gas) may be added to the $N_2$ gas for further improvement of the cooling effect of the wafer as long as there is no problem in the process and safety.

In addition, the pressure adjustment gas in the process chamber 110 may be distinct from the wafer cooling gas. For example, $N_2$ gas may be used for adjustment of the internal pressure of the process chamber 110, while diluted He gas may be used for wafer cooling.

Further, although it has been illustrated in the above embodiments that a wafer is subjected to a process, the target to be processed may be a photomask, a printed circuit board, a liquid crystal panel, a compact disk, a magnetic disk, etc.

<Additional Aspects of Present Disclosure>

Hereinafter, some aspects of the present disclosure will be additionally stated.

A first aspect of the present disclosure may provide a substrate processing apparatus including: a process chamber which processes a substrate; a conductive substrate support table which is installed within the process chamber; a dielectric plate on which the substrate is mounted, the dielectric plate being placed on the substrate support table; a microwave generator which is installed outside the process chamber; and a microwave supplying unit which supplies a microwave generated by the microwave generator into the process chamber.

A second aspect of the present disclosure provides the substrate processing apparatus of the first aspect, wherein, assuming that a wavelength of the supplied microwave in a vacuum is $\lambda$ and a dielectric constant of the dielectric plate is $\in$, a thickness of the dielectric plate is equal to or near an odd-number times of $(\lambda/4) \times (\in)^{-1/2}$. That is, the second aspect of the present disclosure provides the substrate processing apparatus of the first aspect, wherein the thickness of the dielectric plate is within a $\frac{1}{8}$ wavelength range from an odd-number times of a $\frac{1}{4}$ wavelength of the microwave in the dielectric plate.

A third aspect of the present disclosure provides the substrate processing apparatus of the second aspect, wherein the thickness of the dielectric plate is within a $\frac{1}{8}$ wavelength range of $(\lambda/4) \times (\in)^{-1/2}$.

A fourth aspect of the present disclosure provides the substrate processing apparatus of one of the first to third aspects, wherein the substrate support table has a cooling structure.

A fifth aspect of the present disclosure provides the substrate processing apparatus of one of the first to fourth aspects, wherein a temperature detector for measuring a temperature of the dielectric plate is disposed in the dielectric plate.

A sixth aspect of the present disclosure provides the substrate processing apparatus of one of the first to fifth aspects, wherein the dielectric plate is made of quartz.

A seventh aspect of the present disclosure provides the substrate processing apparatus of one of the first to fifth aspects, wherein the dielectric plate is made of alumina.

An eighth aspect of the present disclosure provides the substrate processing apparatus of one of the first to fifth aspects, wherein a product of a dielectric constant and a dielectric tangent of the dielectric plate is smaller than a product of a dielectric constant and a dielectric tangent of a heating target included in the substrate.

A ninth aspect of the present disclosure provides a method for manufacturing a semiconductor device by using a substrate processing apparatus including a process chamber which processes a substrate, a conductive substrate support table which is installed within the process chamber, a dielectric plate on which the substrate is mounted, the dielectric plate being placed on the substrate support table, a microwave generator which is installed outside the process chamber, and a microwave supplying unit which supplies a microwave generated by the microwave generator into the process chamber, including: carrying the substrate into the process chamber and mounting the substrate on the dielectric plate placed on the substrate support table; supplying the microwave from the microwave supplying unit into the process chamber and processing the substrate mounted on the dielectric plate; and carrying the substrate out of the process chamber after processing the substrate.

As described above, according to the substrate processing apparatus and the method for manufacturing a semiconductor device, it is possible to heat a substrate including a heating target while suppressing a substrate temperature from being excessively increased.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a process chamber configured to process a substrate;
   a conductive substrate support table provided within the process chamber;
   a dielectric plate on which the substrate is mounted, the dielectric plate being placed on the substrate support table;
   a microwave generator generating a microwave of a predetermined frequency and provided outside the process chamber; and
   a microwave supplying unit having a wave guide port that irradiates a heating target formed on a surface of the substrate with a microwave generated by the microwave generator to the surface of the substrate;
   wherein a product of a dielectric constant and a dielectric tangent of the dielectric plate is smaller than a product of a dielectric constant and a dielectric tangent of the heating target; and
   a thickness of the dielectric plate is within a $(\lambda/8)*(\in)^{-1/2}$ range centered on an odd-number times of $(\lambda/4) \times (\in)^{-1/2}$, wherein, $\lambda$ is a wavelength of the supplied microwave in a vacuum and $\in$ is the dielectric constant of the dielectric plate.

2. The substrate processing apparatus of claim 1, wherein the substrate support table comprises a cooling structure.

3. The substrate processing apparatus of claim 1, wherein a temperature detector configured to measure a temperature of the dielectric plate is disposed in the dielectric plate.

4. A method for manufacturing a semiconductor device by using a substrate processing apparatus including a process chamber configured to process a substrate, a conductive substrate support table provided within the process chamber, a dielectric plate on which the substrate is mounted, the dielectric plate being placed on the substrate support table, a microwave generator provided outside the process chamber, and a microwave supplying unit having a wave guide port that irradiates the substrate with a microwave generated by the microwave generator into the process chamber, the method comprising:
   carrying the substrate into the process chamber and mounting the substrate on the dielectric plate placed on the substrate support table;
   selecting a frequency of a microwave, which selectively heats a heating target formed on a surface of the substrate, in accordance with a product of a dielectric constant and a dielectric tangent of the dielectric plate and a product of a dielectric constant and a dielectric tangent of the dielectric plate and a product of a dielectric constant and a dielectric tangent of the heating target;
   heating the heating target by irradiating the heating target with the microwave having the selected frequency from the microwave supplying unit to the surface of the substrate; and
   carrying the substrate out of the process chamber after processing the substrate, wherein a product of a dielectric constant and a dielectric tangent of the dielectric plate is smaller than a product of a dielectric constant and a dielectric tangent of the heating target, and a thickness of the dielectric plate is within a $(\lambda/8)*(\in)^{-1/2}$ range centered on and odd-number times of $(\lambda/4)\times(\in)^{-1/2}$, wherein, $\lambda$ is a wavelength of the supplied microwave in a vacuum and $\in$ is the dielectric constant of the dielectric plate.

5. The substrate processing apparatus of claim 1, wherein the heating target formed on the surface of the substrate is a high-k film.

6. The substrate processing apparatus of claim 1, wherein the heating target formed on the surface of the substrate is a polyimide film.

* * * * *